US007778793B2

(12) United States Patent
Bonciolini et al.

(10) Patent No.: US 7,778,793 B2
(45) Date of Patent: Aug. 17, 2010

(54) WIRELESS SENSOR FOR SEMICONDUCTOR PROCESSING SYSTEMS

(75) Inventors: Dennis J. Bonciolini, Tigard, OR (US); Andy K. Lim, Tigard, OR (US)

(73) Assignee: CyberOptics Semiconductor, Inc.

( * ) Notice: Subject to any disclaimer, the term of this patent is extended or adjusted under 35 U.S.C. 154(b) by 0 days.

(21) Appl. No.: 12/045,838

(22) Filed: Mar. 11, 2008

(65) Prior Publication Data

US 2008/0228430 A1    Sep. 18, 2008

Related U.S. Application Data

(60) Provisional application No. 60/906,371, filed on Mar. 12, 2007.

(51) Int. Cl.
*G01P 15/00*    (2006.01)
(52) U.S. Cl. ...................................................... 702/141
(58) Field of Classification Search ................ 702/141, 702/122, 116, 56; 73/493, 511, 514.29
See application file for complete search history.

(56) References Cited

U.S. PATENT DOCUMENTS

| | | | |
|---|---|---|---|
| 3,876,833 A | 4/1975 | Broers et al. ................. 250/492 |
| 4,000,658 A | 1/1977 | Schmidt ........................ 73/490 |
| 4,074,114 A | 2/1978 | Dobras ................... 235/462.07 |
| 4,119,381 A | 10/1978 | Muka et al. .................. 356/244 |
| 4,180,199 A | 12/1979 | O'Rourke et al. ........... 228/102 |
| 4,601,206 A | 7/1986 | Watson ......................... 73/510 |
| 4,701,096 A | 10/1987 | Fisher .................... 414/416.08 |
| 4,750,365 A | 6/1988 | Haws et al. .................... 73/594 |
| 4,753,569 A | 6/1988 | Pryor .......................... 700/250 |
| 4,791,482 A | 12/1988 | Barry et al. ................. 348/136 |
| 4,843,287 A | 6/1989 | Taft ........................ 318/568.16 |
| 5,095,751 A | 3/1992 | Wada et al. ............... 73/514.16 |
| 5,175,601 A | 12/1992 | Fitts ............................ 356/604 |
| 5,232,331 A | 8/1993 | Kasai et al. .................. 414/802 |
| 5,265,957 A | 11/1993 | Moslehi et al. ................. 374/1 |
| 5,267,143 A | 11/1993 | Pryor ........................... 700/56 |

(Continued)

FOREIGN PATENT DOCUMENTS

DE    10105774 A1    8/2001

(Continued)

OTHER PUBLICATIONS

"Final Report on Wireless Wafer Proof-of-Principle," J.B. Wilgen, et al., Oak Ridge National Laboratory, Jan. 18, 1998.

(Continued)

*Primary Examiner*—Bryan Bui
(74) *Attorney, Agent, or Firm*—Christopher R. Christenson; Westman, Champlin & Kelly, P.A.

(57) ABSTRACT

A wireless sensor is provided to obtain information relating to vibration of wafers or substrates in a semiconductor processing system. In one exemplary embodiment, a wireless substrate-like sensor is provided and includes a power source adapted to provide power to the sensor, a wireless communication module coupled to the power source, and a controller coupled to the power source and the wireless communication module. An acceleration detection component is operably coupled to the controller to provide information relative to acceleration of the sensor in three axes.

18 Claims, 7 Drawing Sheets

U.S. PATENT DOCUMENTS

| | | | |
|---|---|---|---|
| 5,298,363 A | 3/1994 | Weiss | 430/296 |
| 5,301,248 A | 4/1994 | Takanori et al. | 382/147 |
| 5,321,989 A | 6/1994 | Zimmer et al. | 73/724 |
| 5,435,682 A | 7/1995 | Crabb et al. | 414/217 |
| 5,444,637 A | 8/1995 | Smesny et al. | 364/556 |
| 5,521,123 A | 5/1996 | Komatsu et al. | 437/209 |
| 5,573,728 A | 11/1996 | Loesch et al. | 422/90 |
| 5,619,027 A | 4/1997 | Ackley | 235/462.01 |
| 5,642,293 A | 6/1997 | Manthey et al. | 702/42 |
| 5,675,396 A | 10/1997 | Tsunehiro | 349/59 |
| 5,721,677 A | 2/1998 | Pryor | 700/61 |
| 5,726,066 A | 3/1998 | Choi | 437/3 |
| 5,742,702 A | 4/1998 | Oki | 382/156 |
| 5,783,341 A | 7/1998 | Uzawa | 430/22 |
| 5,786,704 A | 7/1998 | Kim | 324/765 |
| 5,805,289 A | 9/1998 | Corby et al. | 356/614 |
| 5,956,417 A | 9/1999 | Pryor | 382/154 |
| 5,962,909 A | 10/1999 | Jerominek et al. | 257/522 |
| 5,969,639 A | 10/1999 | Lauf et al. | 340/870.17 |
| 5,973,788 A | 10/1999 | Pettersen et al. | 356/614 |
| 5,981,116 A | 11/1999 | Ota | 430/22 |
| 6,010,009 A | 1/2000 | Peterson et al. | 206/711 |
| 6,013,236 A | 1/2000 | Takahashi et al. | 423/345 |
| 6,022,811 A | 2/2000 | Yuuki et al. | 438/758 |
| 6,075,909 A | 6/2000 | Ressl | 385/14 |
| 6,106,457 A | 8/2000 | Perkins et al. | 600/175 |
| 6,129,278 A | 10/2000 | Wang et al. | 235/462.01 |
| 6,175,124 B1 | 1/2001 | Cole et al. | 257/48 |
| 6,206,441 B1 | 3/2001 | Wen et al. | 294/1.1 |
| 6,232,615 B1 | 5/2001 | Van Empel | 250/548 |
| 6,244,121 B1 | 6/2001 | Hunter | 73/865.9 |
| 6,275,742 B1 | 8/2001 | Sagues et al. | 700/213 |
| 6,300,974 B1 | 10/2001 | Viala et al. | 348/61 |
| 6,325,536 B1 | 12/2001 | Renken et al. | 374/161 |
| 6,326,228 B1 | 12/2001 | Hughes et al. | 438/49 |
| 6,338,280 B1 | 1/2002 | Dorsch et al. | 73/865.9 |
| 6,389,158 B1 | 5/2002 | Pettersen et al. | 382/154 |
| 6,466,325 B1 | 10/2002 | Gooch | 356/620 |
| 6,468,816 B2 | 10/2002 | Hunter | 438/14 |
| 6,476,825 B1 | 11/2002 | Croy et al. | 715/716 |
| 6,480,537 B1 | 11/2002 | Agrawal et al. | 375/240 |
| 6,526,668 B1 | 3/2003 | Harrell et al. | 33/366.11 |
| 6,532,403 B2 | 3/2003 | Beckhart et al. | 700/254 |
| 6,535,650 B1 | 3/2003 | Poulo et al. | 382/284 |
| 6,603,117 B2 | 8/2003 | Corrado et al. | 250/239 |
| 6,607,951 B2 | 8/2003 | Chen et al. | 438/199 |
| 6,625,305 B1 | 9/2003 | Keren | 382/162 |
| 6,628,803 B1 | 9/2003 | Wakashiro et al. | 382/103 |
| 6,681,151 B1 | 1/2004 | Weinzimmer et al. | 700/259 |
| 6,691,068 B1 | 2/2004 | Freed et al. | 702/187 |
| 6,701,788 B2 | 3/2004 | Babala | 73/649 |
| 6,734,027 B2 | 5/2004 | Jonkers | 438/14 |
| 6,801,257 B2 | 10/2004 | Segev et al. | 348/296 |
| 6,852,975 B2 | 2/2005 | Riegl et al. | 250/334 |
| 6,925,356 B2 | 8/2005 | Schauer et al. | 700/213 |
| 6,958,768 B1 | 10/2005 | Rao et al. | 348/86 |
| 6,966,235 B1 | 11/2005 | Paton | 73/865.9 |
| 6,985,169 B1 | 1/2006 | Deng et al. | 348/61 |
| 6,990,215 B1 | 1/2006 | Brown et al. | 382/106 |
| 7,035,913 B2 | 4/2006 | Culp et al. | 709/218 |
| 7,135,852 B2 | 11/2006 | Renken et al. | 324/158.1 |
| 7,149,643 B2 | 12/2006 | Renken et al. | 702/122 |
| 7,151,366 B2 | 12/2006 | Renken et al. | 324/158.1 |
| 7,158,857 B2 | 1/2007 | Schauer et al. | 700/218 |
| 7,180,607 B2 | 2/2007 | Kyle et al. | 356/614 |
| 7,206,080 B2 | 4/2007 | Kochi et al. | 356/611 |
| 7,222,789 B2 | 5/2007 | Longacre et al. | 235/450 |
| 7,231,825 B2 | 6/2007 | Davidson | 73/510 |
| 7,253,079 B2 | 8/2007 | Hanson et al. | 438/417 |
| 7,284,429 B2 | 10/2007 | Chaumet et al. | 73/504.12 |
| 7,289,230 B2 | 10/2007 | Ramsey et al. | 356/621 |
| 2001/0034222 A1 | 10/2001 | Roustaei et al. | 455/403 |
| 2001/0050769 A1 | 12/2001 | Fujinaka | 356/121 |
| 2002/0006675 A1 | 1/2002 | Shigaraki | 438/4 |
| 2002/0028629 A1 | 3/2002 | Moore | 451/6 |
| 2002/0078770 A1 | 6/2002 | Hunter | 73/865.9 |
| 2002/0092369 A1 | 7/2002 | Hunter | 73/865.9 |
| 2002/0101508 A1 | 8/2002 | Pollack | 348/85 |
| 2002/0148307 A1 | 10/2002 | Jonkers | 73/865.9 |
| 2003/0001083 A1 | 1/2003 | Corrado et al. | 250/239 |
| 2003/0112448 A1 | 6/2003 | Maidhof et al. | 356/603 |
| 2003/0127589 A1 | 7/2003 | Corrado et al. | 250/239 |
| 2003/0160883 A1 | 8/2003 | Ariel et al. | 348/308 |
| 2003/0209097 A1 | 11/2003 | Hunter | 73/865.9 |
| 2006/0001992 A1 | 1/2006 | Friedrichs | 360/6 |
| 2006/0171561 A1* | 8/2006 | Ramsey et al. | 382/103 |
| 2006/0185432 A1* | 8/2006 | Weinberg | 73/510 |
| 2008/0087116 A1* | 4/2008 | Rate et al. | 73/865.9 |

FOREIGN PATENT DOCUMENTS

| | | |
|---|---|---|
| DE | 102 50 358 A1 | 5/2004 |
| EP | 0 507 582 A1 | 10/1992 |
| EP | 0583007 B1 | 10/1997 |
| EP | 1150187 A2 | 10/2001 |
| EP | 1184805 A1 | 3/2002 |
| JP | 1082823 | 9/1987 |
| JP | 62054108 | 9/1987 |
| JP | 3214783 A2 | 9/1991 |
| JP | 06163340 | 11/1992 |
| JP | 06076193 | 6/1993 |
| JP | 7074229 | 6/1993 |
| JP | 163340 | 6/1994 |
| JP | 7280644 A2 | 10/1995 |
| JP | 8233855 A2 | 9/1996 |
| JP | 11307606 | 4/1998 |
| JP | 11260706 | 9/1999 |
| JP | 2004-276151 | 10/2004 |
| WO | WO 00/12263 | 3/2000 |
| WO | WO 00/70495 | 11/2000 |
| WO | WO 01/65317 A2 | 9/2001 |
| WO | WO 01/88976 | 11/2001 |
| WO | WO 02/17364 | 2/2002 |
| WO | WO 02/29385 | 4/2002 |
| WO | WO 02/47115 | 6/2002 |
| WO | WO 03/060989 A1 | 7/2003 |

OTHER PUBLICATIONS

"Autonomous Micro-sensor Arrays for Process Control of Semiconductor Manufacturing Processes," Darin Fisher, et al., Jun. 4, 1998. NSF Award Abstract—#9628420, https://www.fastlane.nsf.gov/servlet/showaward?award=9628420.

International Preliminary Examination Report from International Application No. PCT/US03/03247, filed Feb. 4, 2003.

Invitation to Pay Fees from International Application No. PCT/US2005/007656, filed Mar. 3, 2005.

International Search Report from International Application No. PCT/US2005/007418, filed Mar. 9, 2005.

International Preliminary Examination Report and Written Opinion from International Application No. PCT/US2005/007656, filed Mar. 9, 2005.

Notification of Transmittal of the International Preliminary Report from International Applicaton No. PCT/US05/007423, filed Mar. 9, 2005; Notification of Transmittal of the International Search Report and Written Opinion from International Application No. PCT/US05/007423, filed Mar. 9, 2005.

Notification of Transmittal of the International Search Report and Written Opinion from International Application No. PCT/US05/007656, filed Mar. 9, 2005; Notification of Transmittal of the International Preliminary Report on Patentability from International Application No. PCT/US05/007656, filed Mar. 9, 2005.

Notification of Transmittal of International Preliminary Examination Report from International Application No. PCT/US05/007418, filed Mar. 9, 2005; Notification of the International Search Report and Written Opinion from International Applicaton No. PCT/US05/007418, filed Mar. 9, 2005.

"SEMI M1-0707 Specification for Polished Monochrystoline Silicon Wafers," Semiconductor Equipment and Materials International, 2007.

Search Report of European Patent Office in Patent Application PCT/US2007/020815 filed Sep. 27, 2007.

Tsai, J.M. and Fedder, G.K., "Mechanical Noise-Limited CMOS-MEMS Accelerometers," 18$^{th}$ IEEE International Conference, p. 630-633, 2005.

Kim, S. and Chum, K., "A new inertial sensing paradigm using an accelerometer array: XL-array." Proceedings of the SPIE, vol. 3892, pp. 204-211, 1999.

Olson, R.H. and Carr, D.W., "A Digital Accelerometer Array Utilizing Suprathreshold Stochastic Resonance for Detection of Sub-Brownian Noise Floor Accelerations," Sandia National Laboratories, Sandia Report SAND2004-6441, 2004.

International Preliminary Report on Patentability for Patent Application PCT/US2007/020815 filed Sep. 27, 2007.

\* cited by examiner

WIRELESS SENSOR FOR SEMICONDUCTOR PROCESSING SYSTEMS

CROSS-REFERENCE OF CO-PENDING APPLICATIONS

The present application claims priority to previously filed provisional application Ser. No. 60/906,371, filed Mar. 12, 2007, entitled WIRELESS 3-AXIS MEMS VIBRATION SENSOR FOR SEMICONDUCTOR PROCESSING, which application is incorporated herein by reference in its entirety.

BACKGROUND

Semiconductor processing systems are characterized by extremely clean environments and extremely precise semiconductor wafer movement. Industries place extensive reliance upon high-precision robotic systems to move substrates, such as semiconductor wafers, about the various processing stations within a semiconductor processing system with the requisite precision.

Reliable and efficient operation of such robotic systems depends on precise positioning, alignment, and/or parallelism of the components. Accurate wafer location minimizes the chance that a wafer may accidentally scrape against the walls of a wafer processing system. Accurate wafer location on a process pedestal in a process chamber may be required to optimize the yield of that process. Precise parallelism between surfaces within the semiconductor processing systems is important to ensure minimal substrate sliding or movement during transfer from a robotic end effector to wafer carrier shelves, pre-aligner vacuum chucks, load lock elevator shelves, process chamber transfer pins and/or pedestals. When a wafer slides against a support, particles may be scraped off that cause yield loss. Misplaced or misaligned components, even on the scale of fractions of a millimeter, can impact the cooperation of the various components within the semiconductor processing system, causing reduced product yield and/or quality.

This precise positioning must be achieved in initial manufacture, and must be maintained during system use. Component positioning can be altered because of normal wear, or as a result of procedures for maintenance, repair, alteration, or replacement. Accordingly, it becomes very important to automatically measure and compensate for relatively minute positional variations in the various components of a semiconductor processing system.

In the past, attempts have been made to provide substrate-like sensors in the form of a substrate, such as a wafer, which can be moved through the semiconductor processing system to wirelessly convey information such as substrate inclination and acceleration within the semiconductor system. One particular example of such a system is shown in U.S. Pat. No. 6,244,121 to Reginald Hunter. That system includes an inclinometer that has a cavity that is partially filled with a conductive fluid, such as mercury, and an array of probes disposed vertically in the cavity into the conductive fluid. Additionally, the system of the '121 patent provides an accelerometer that mounts to the support platform and senses the acceleration of the sensor device.

High accuracy accelerometers used for level sensing tend to be relatively expensive and large, most notably in the z-axis, because they contain large moving parts. The utilization of bulky accelerometers, such as bulky electrolytic accelerometers, or large microelectromechanical system (MEMS) accelerometers can provide a high signal-to-noise (S/N) ratio, but demand large vertical z-axis space. Additionally, these accelerometers are generally relatively costly and increase the overall cost of the substrate-like sensor.

Given that a substrate-like sensor must, by virtue of its design, be able to move through a semiconductor processing system in the same way that a substrate does, it is imperative that the substrate-like sensor not exceed the physical envelope allowed for the substrate. Common wafer dimensions and characteristics may be found in the following specification: SEMI M1-0302, "Specification for Polished Monochrystoline Silicon Wafers", Semiconductor Equipment and Materials International, www.semi.org. The selection of the accelerometer for use with the substrate-like sensor is constrained by the issue of cost as well as the height of the overall accelerometer.

SUMMARY

A wireless sensor is provided to obtain information relating to vibration of wafers or substrates in a semiconductor processing system. In one embodiment, a wireless substrate-like sensor is provided and includes a power source adapted to provide power to the sensor, a wireless communication module coupled to the power source, and a controller coupled to the power source and the wireless communication module. An acceleration detection component is operably coupled to the controller to provide information relative to acceleration of the sensor in three axes.

In one embodiment, a carrier is provided and configured to carry a plurality of substrates. The carrier includes a plurality of slots where each slot is configured to carry a respective substrate. The carrier also includes a sensor within the carrier to transduce acceleration to which the carrier is subjected. The sensor has a wireless communication module for providing information relative to the acceleration.

DETAILED DESCRIPTION OF THE PREFERRED EMBODIMENTS

In a semiconductor processing system, there are multiple tools and/or multiple process steps that a wafer, or substrate, sees, or is exposed to. During each of these steps, there are potential defects caused by transportation vibration of the substrates. Defects caused by such vibration can be reduced, or even eliminated, by optimizing robotic handling and transport equipment of the semiconductor processing system. While aspects of the prior art have provided wireless substrate-like semiconductor sensors, the information provided by such sensors has been limited. To significantly improve, or optimize, robotic handling and transport equipment and/or facilitate semiconductor processing system alignment and calibration, more functionality is required than has been heretofore provided by wireless substrate-like sensors.

Embodiments described herein generally provide a wireless sensor configured to provide acceleration information and provide wireless transmission of the acceleration information to an external device, such as a device outside the semiconductor processing system. Further, one or more embodiments described herein provide a wireless substrate-like sensor. As used herein, "substrate-like" is intended to mean a sensor in the form of substrate such as a semiconductor wafer, a Liquid Crystal Display glass panel, reticle, or the like. In accordance with one embodiment, a wireless substrate-like sensor has a form factor and weight that closely imitate a substrate generally processed by the semiconductor processing system.

Figure 1:
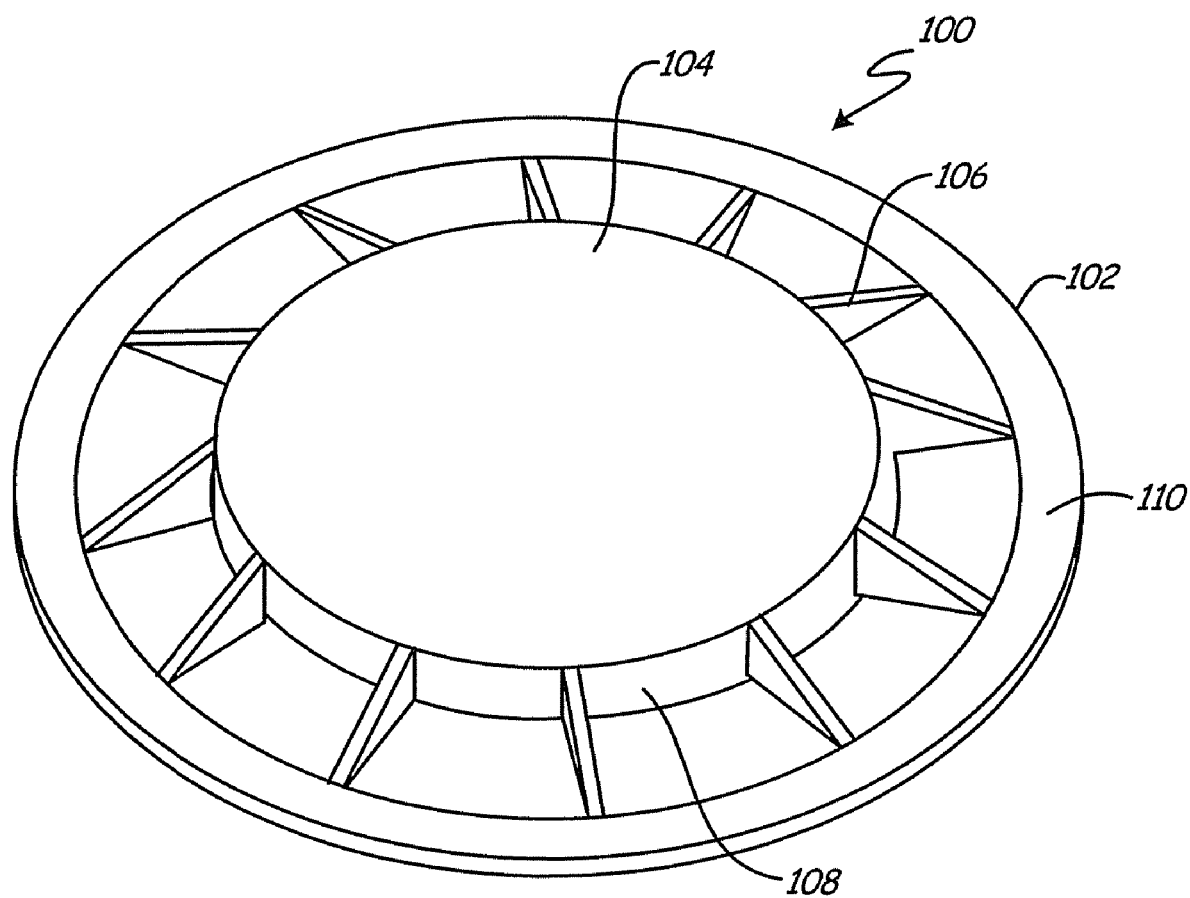
FIG. 1 is a perspective view of a wireless substrate-like sensor, in accordance with one embodiment.

FIG. 1 is a perspective view of a wireless substrate-like sensor in accordance with one embodiment. Sensor 100 includes substrate-like portion 102 that is preferably sized to have a diameter that is equal to that of a standard substrate size. Exemplary sizes include a 200 millimeter diameter, or a 300 millimeter diameter. However, as different standards are developed or employed, this dimension can vary. Sensor 100 includes electronics housing or enclosure 104 that is disposed upon substrate-like portion 102. In order to increase the rigidity of the overall sensor 100, a plurality of fins or struts 106 are provided that couple side wall 108 of electronics enclosure 104 to surface 110 of substrate-like portion 102. In order to pass easily through the sealed semiconductor processing chamber, it is necessary for substrate-like sensor 102 to have a form factor, including an overall height, that is very similar, if not identical, to an actual substrate.

Figure 2:
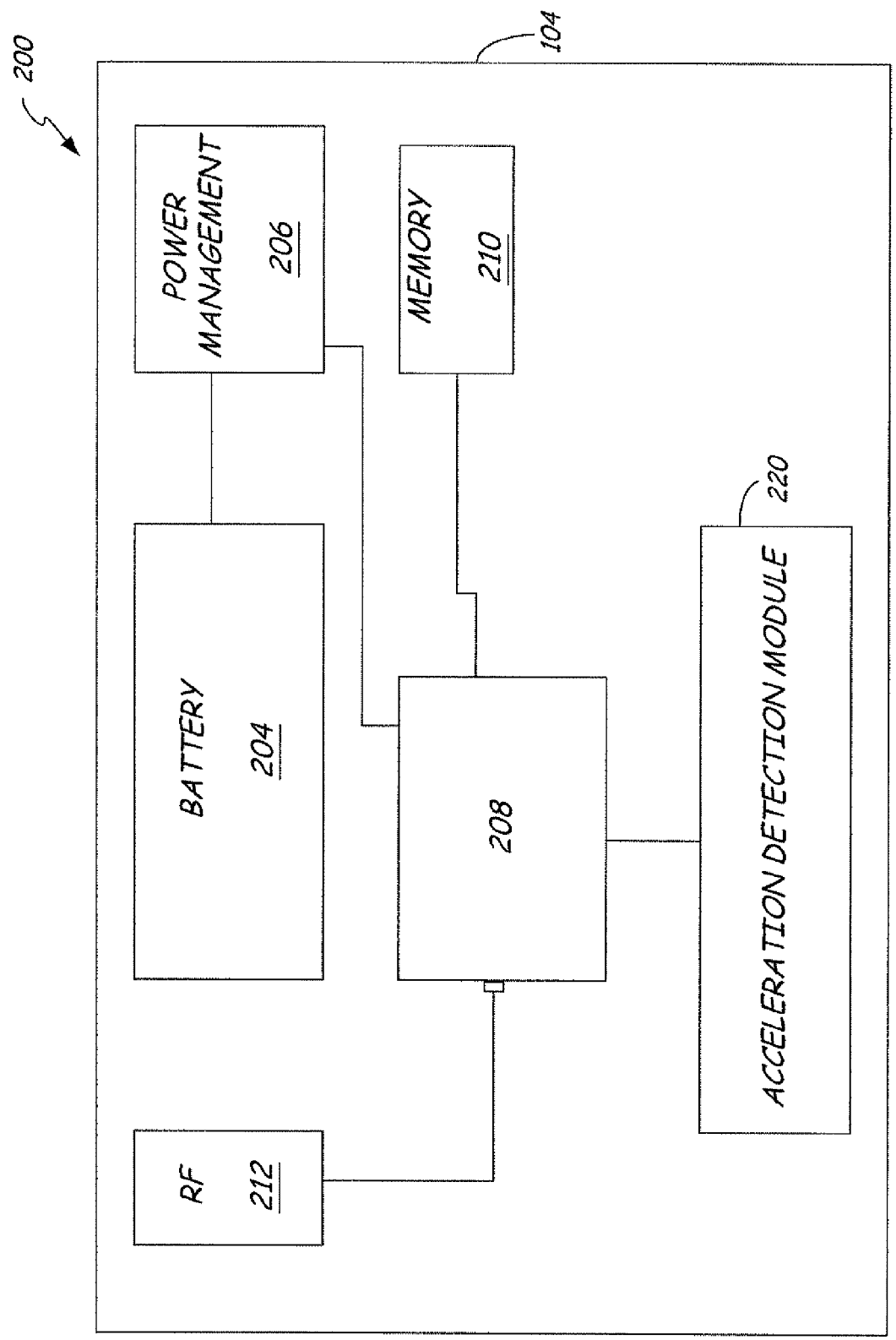
FIG. 2 is a block diagram of a wireless substrate-like sensor, in accordance with one embodiment.

FIG. 2 is a block diagram of a wireless substrate-like sensor in accordance with one embodiment. Sensor 200 includes electronics enclosure 104, which houses battery 204, power management module 206, controller 208, memory 210, and a wireless communication module 212, illustratively a radio-frequency (RF) module.

Further, sensor 200 includes an acceleration detection module 220 comprising one or more acceleration sensors, such as accelerometers and the like. While acceleration detection module 220 is illustrated in FIG. 2 within enclosure 104, it may form part of enclosure 104, or may be disposed proximate, but external to enclosure 104.

As illustrated in FIG. 2, battery 204 is disposed within enclosure 104 and is coupled to controller 208 via power management module 206. In one embodiment, power management module 206 is a power management integrated circuit available from Linear Technology Corporation under the trade designation LTC3443. In one embodiment, controller 208 is a microprocessor available from Texas Instruments under the trade designation MSC1211Y5. Controller 208 is coupled to memory module 210, which can take the form of any type of memory, including memory that is internal to controller 208 as well as memory that is external to controller 208. The controller can include internal SRAM, flash RAM and/or boot ROM. Memory module 210 also includes, in one example, external flash memory having a size of 64K×8. Flash memory is useful for storing such non-volatile data as programs, calibration data, and/or non-changing data as may be required. The internal random access memory is useful for storing volatile data relevant to program operation.

Controller 208 is coupled via a suitable port, such as a serial port, to radio frequency communication module 212 in order to communicate with external devices. In one embodiment, radio-frequency module 212 operates in accordance with the well-known Bluetooth standard, Bluetooth core specification version 1.1 (Feb. 22, 2001), available from the Bluetooth SIG (www.bluethooth.com). One example of module 212 is available form Mitsumi under the trade designation WMLC40. Additionally, other forms of wireless communication can be used in addition to, or instead of, module 212. Suitable examples of such wireless communication include any other form of radio frequency communication, acoustic communication, optical communication, of which infrared communication is an example, or even communication employing magnetic induction.

Controller 208 is coupled to acceleration detection module 220 and senses acceleration experienced by wireless substrate-like sensor 200. Such acceleration may include that caused by physical movements of wireless substrate-like sensor 200, the force and orientation of gravity, or a combination thereof.

In the illustrated embodiment, acceleration detection module 220 includes at least one accelerometer configured to obtain acceleration information relative to sensor 200. The acceleration information can be indicative of vibration and/or shock, for example, to which sensor 200 is exposed. Preferably, acceleration detection module 220 provides acceleration information to controller 208 indicative of acceleration experienced by sensor 200 in three or more directions. The acceleration information can be stored in memory 210 and/or transmitted by module 212 to an external device, for example. In this manner, sensor 200 is configured to obtain and transmit acceleration information observed by module 220 relative to multiple axes. In one embodiment, the acceleration information provided by module 220 comprises acceleration information relative to three or more axes. In one particular embodiment, module 220 includes a 3-axis accelerometer, or a combination of single and/or dual-axis accelerometers, configured to provide acceleration information relative to three nominally orthogonal axes.

Figure 3:
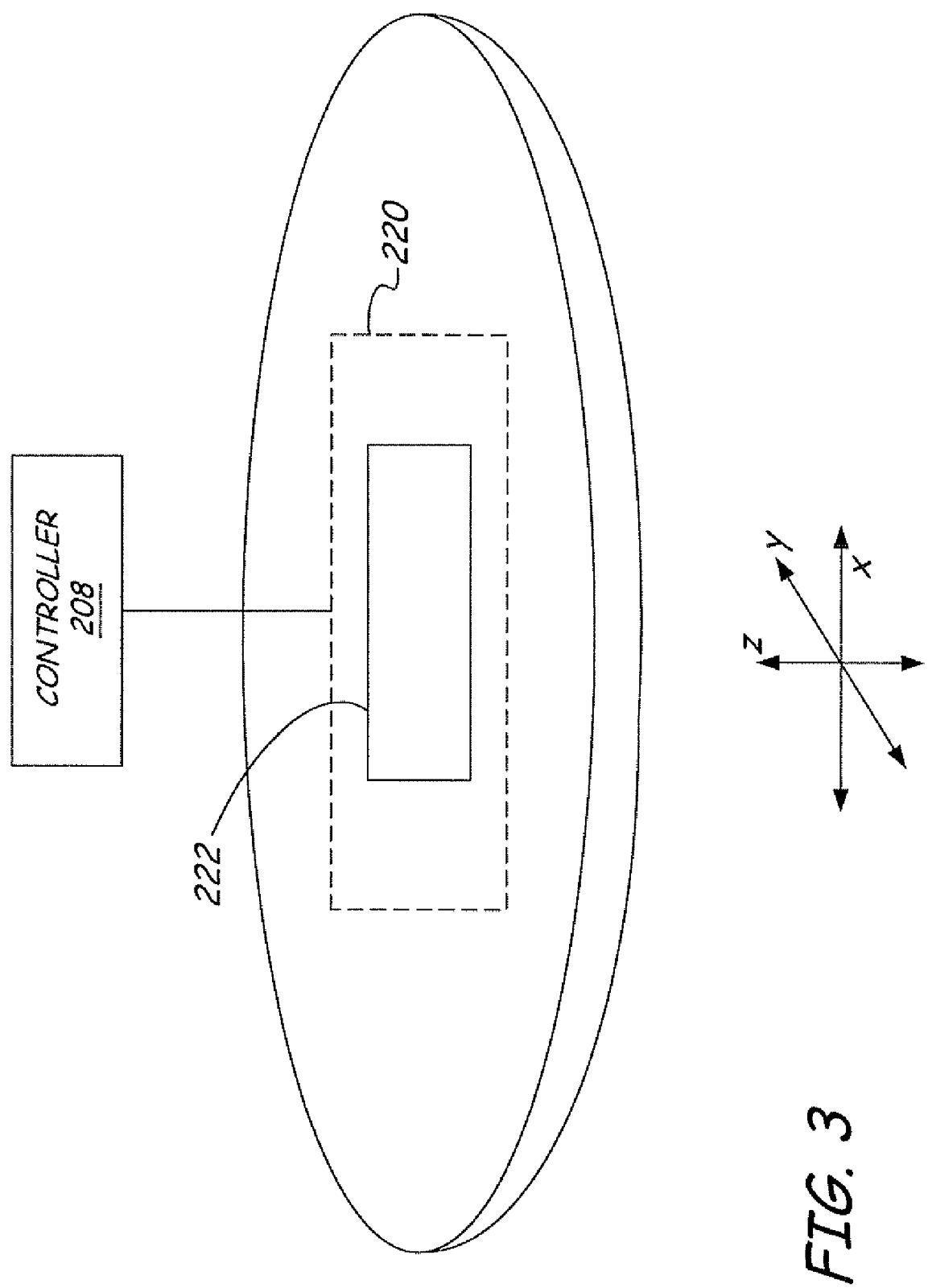
FIG. 3 is a diagrammatic view of an acceleration detection component configured to detect acceleration in three-axes, in accordance with one embodiment.

To illustrate, FIG. 3 is a diagrammatic view of one embodiment of module 220 having a 3-axis accelerometer 222. Accelerometer 222 is configured to provide acceleration information to controller 208 relative to three nominally orthogonal, or substantially orthogonal, axes, illustratively axes x, y, and z. The acceleration information provided by accelerometer 222 can be utilized by controller 208 and/or other device(s) within, or external to, sensor 220 to identify a direction of an observed shock and/or vibration experienced by sensor 200. It is noted that this is an example of one orientation of module 220. Module 220 can be configured to provide acceleration information relative to axes in other orientations, such as relative to axes that are not orthogonal and/or relative to more than or less than three axes. Further, the acceleration information provided by module 220 can include rotational acceleration and/or information relative to axes of rotational acceleration.

Figure 4:
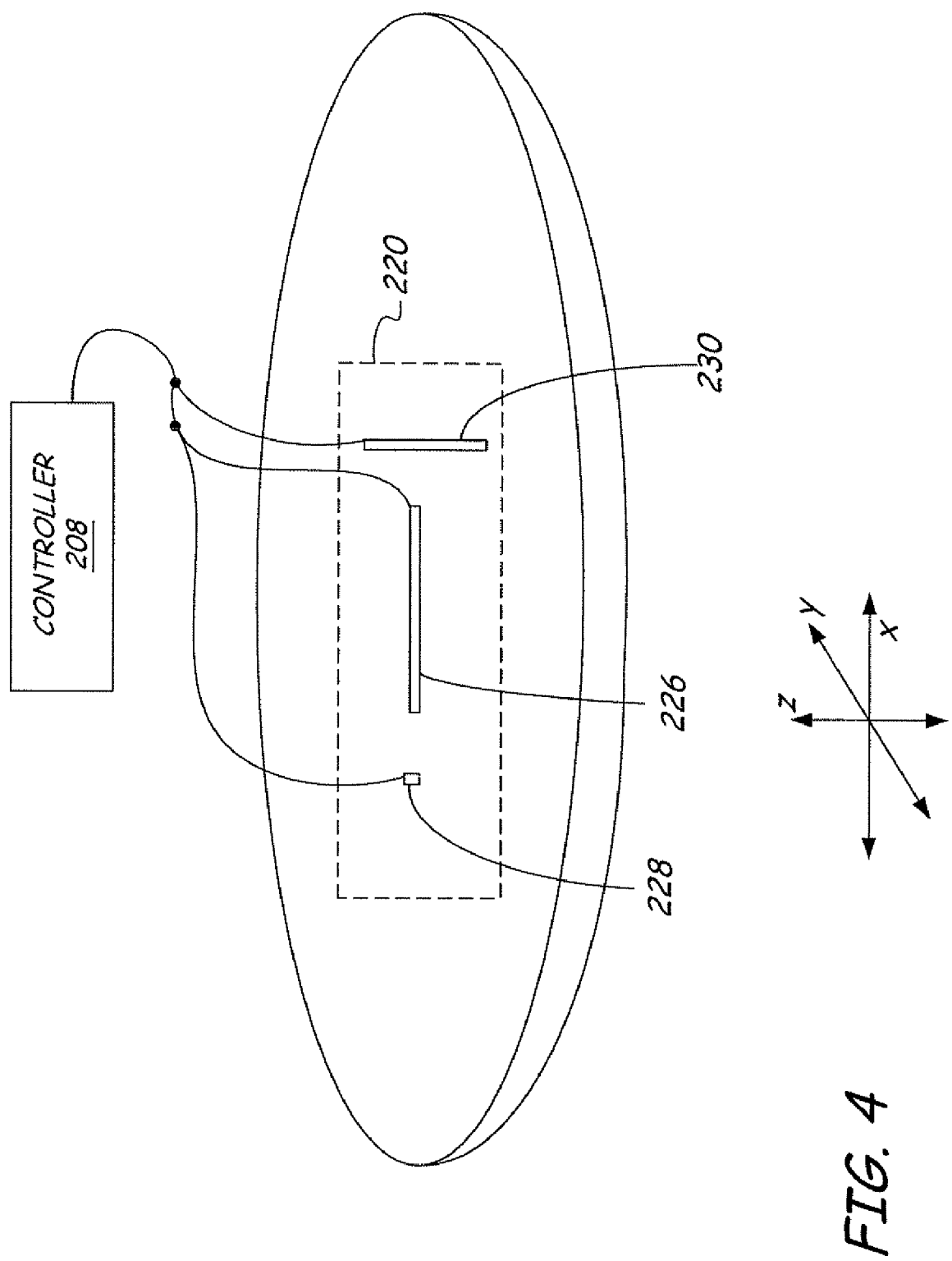
FIG. 4 is a diagrammatic view of a plurality of individual accelerometers, in accordance with one embodiment.

In one embodiment, illustrated in FIG. 4, module 220 can include a plurality of individual accelerometers. In the embodiment illustrated in FIG. 4, module 220 includes three accelerometers 226, 228, and 230 that are arranged to be responsive to acceleration in different directions. As illustrated, accelerometers 226, 228, and 230 are each responsive to acceleration in one of a plurality of orthogonal directions, represented in FIG. 4 by axes x, y, and z. The number of individual accelerometers illustrated in FIG. 4 is arbitrary, and is intended to illustrate the utilization of a plurality of individual accelerometers arranged to sense acceleration in different directions. Each of the various accelerometers 222, 226, 228, 230 is coupled to controller 208. Controller 208, either through circuitry, or computation, is able to use the individual signals from the various accelerometers, 226, 228, 230 and provide a acceleration output.

Referring again to FIG. 2, in accordance with one embodiment, wireless substrate-like sensor 200 is configured to have MEMS accelerometer device(s) providing 3-axes of response. For example, module 220 can include one or more MEMS accelerometer devices, each device providing an output indicative of acceleration in one or more directions. In one embodiment, piezo-based MEMS sensors can be utilized to provide a relatively high bandwidth. In some applications, a high bandwidth may be required to obtain better frequency response of the vibrations. However, piezo-based MEMS devices are considered to be somewhat noisy compared to regular MEMS devices. If the required frequency response is not above approximately 500 Hertz, a regular 3-axis MEMS device is a preferred solution.

The acceleration information obtained by module 220 can be processed (i.e., analyzed, converted, compressed, et cetera) by sensor 200, for example by module 220 and/or controller 208. The processed and/or raw data is transmitted by wireless communication module 212 to an external device and/or software application configured to display and/or perform analysis of the acceleration information, such as the frequency and amplitude of an observed shock and/or vibration. In one embodiment, sensor 200 sends three-axis acceleration information in real-time, or substantially real-time, via wireless communication module 212 to another device located nearby to allow for optimization and/or adjustment of the robotic handling and/or transport systems. For example, the acceleration information can be sent in substantially real-time to a device that is external to sensor 200, such as a device located either within or outside of the semiconductor processing environment. Alternatively, or in addition, a "store and forward" configuration can be utilized in which the acceleration information is temporarily stored in memory, such as memory 210, before transmission of the data from sensor 200 to an external device. The acceleration information transmitted by sensor 200 can be displayed and utilized for optimization and/or adjustment of a robotic handling system, for example. In one example, an operator and/or processing component adjust a parameter within the semiconductor processing environment based on an observed vibration and/or shock indicated by the acceleration information.

As used herein, the terms "real-time" or "substantially real-time" are utilized to indicate that a particular data operation (e.g., processing, displaying, transmitting, et cetera) occurs within a short period of time after the time at which the acceleration for which the data pertains was observed, such that the particular data operation occurs at substantially, or virtually, the same time. To illustrate, in one embodiment RF module 212 transmits acceleration information received from module 220 and the transmitted data is displayed for viewing by an operator with limited overall delay such that, in the operator's perception, the data is displayed at the same time, or nearly the same time, as the event that generated the data. This is said to be in real-time, or substantially real-time. In one illustrative example, RF module 212 transmits the acceleration information within a time duration that is less than 0.5 seconds after the observed acceleration to which the acceleration information pertains occurred. In another illustrative example, RF module 212 transmits acceleration information within a time duration of 0.1 seconds. It is noted that these time intervals are provided by way of example to illustrate "real-time" and are not intended to limit the scope of the concepts described herein.

In one embodiment, data is transmitted from sensor 200 in data packets. These data packets are preferably stored for a very short time within sensor 200, such as in memory 210, until they are ready for transmission. However, the storage time is sufficiently short such that transmission is still considered to occur in real-time, or substantially real-time. The short storage time facilitates the use of data packets in communication methods that incorporate the use of packets as part of the scheme of providing reliable transmission of data.

In instances where communication of data from sensor 200 is not available for a period of time, a "store and forward" configuration can be utilized. For example, in some instances a data communication channel from sensor 200 may not be available, for either a specific or indefinite period of time, for any of a variety of reasons. In one embodiment, a "store and forward" configuration includes temporarily storing data, such as in memory 210, until a communication channel is available to transmit the data from sensor 200. In this manner, there is a delay between the time at which data is obtained by module 220 and the time when the data is transmitted from sensor 200. In other words, in this example the transmission of data is not in real-time. In such cases, controller 208 can include the capability of performing data analysis and/or data compression to effectively reduce the amount of data that must be stored for later transmission.

It is noted that additional sensors or detectors can be provided in sensor 200 and configured to provide relevant information regarding any additional conditions within a semiconductor processing system. Such detectors can include one or more thermometers, accelerometers, inclinometers, compasses (magnetic field direction detectors), light detectors, pressure detectors, electric field strength detectors, magnetic field strength detectors, acidity detectors, acoustic detectors, humidity detectors, chemical moiety activity detectors, gyroscopes, proximity detector, or any other types of detector as may be appropriate.

Figure 5:
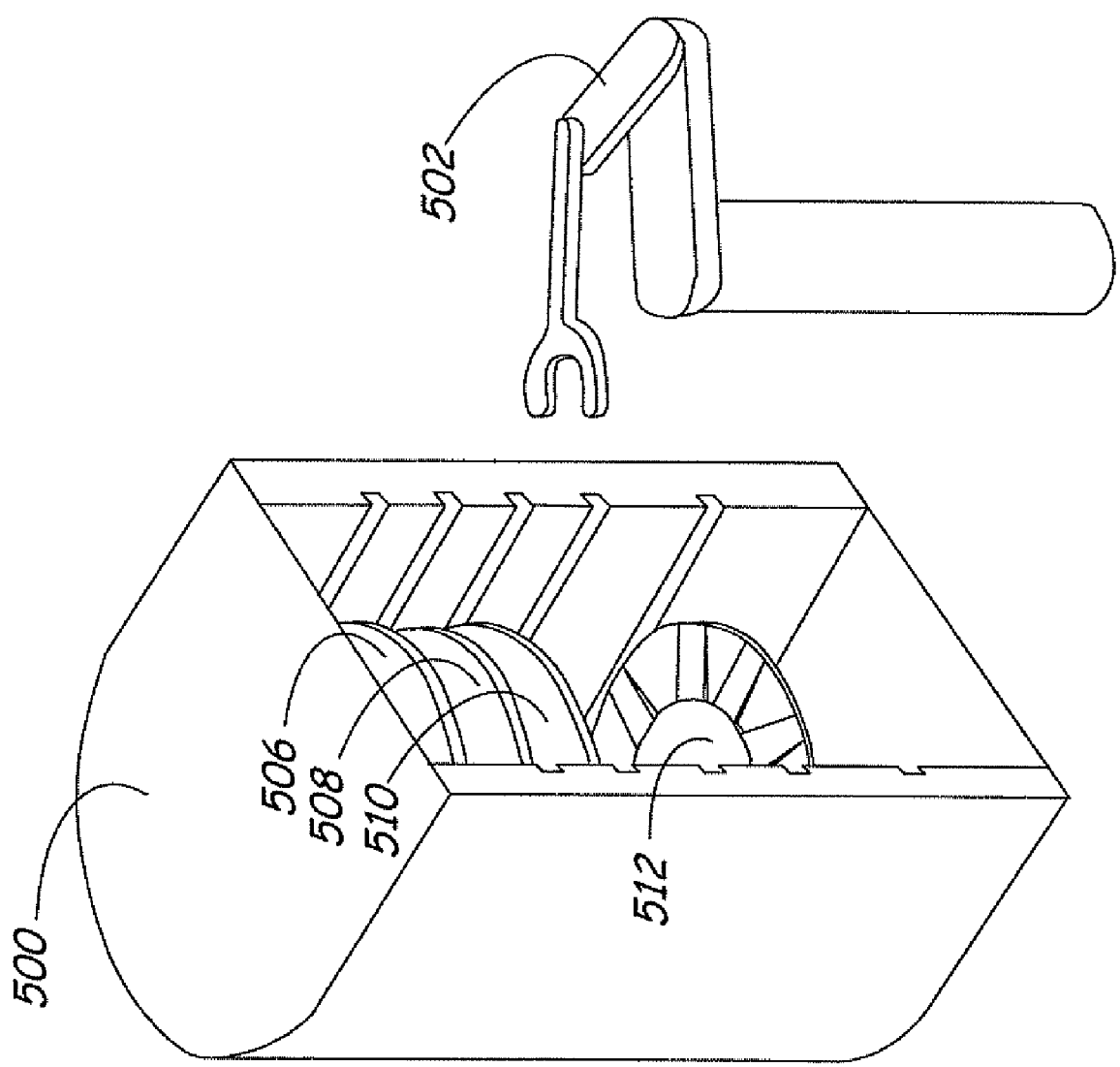
FIG. 5 is a diagrammatic view of a semiconductor wafer process environment.

FIG. 5 is a diagrammatic view of one embodiment of a semiconductor wafer processing environment including a wafer container 500 and a robot 502. Container 500 is illustratively a Front Opening Unified Pod (FOUP) comprising an enclosure designed to hold wafers, or substrates, securely and safely in a controlled environment, and to allow the substrates to be removed by robot 502 for processing and/or measurement within the processing environment, for example. Container 500 is illustrated containing three wafers 506, 508, 510 and wireless substrate-like sensor 512. Sensor 512 is illustratively similar to substrate-like sensor 100 illustrated in FIG. 1. As illustrated in FIG. 5, sensor 512 is embodied in a form factor allowing it to be moveable within the semiconductor wafer processing environment in the same manner as wafers 506-510.

In accordance with one embodiment, sensor 512 is configured to be charged while positioned within container 500. For instance, a power source (e.g., battery 204) of sensor 512 can be configured for in situ recharging within container 500. In one embodiment, container 500 includes suitable contacts (not shown in FIG. 5) to electrically couple to the wireless substrate-like sensor 512 to thereby recharge the power source within sensor 512. Such coupling can occur via any suitable methods including: inductive, photovoltaic, capacitive, and conductive methods. In this manner, sensor 512 is configured to be operated autonomously within the processing environment at any time. For example, sensor 512 can be configured to be utilized within the semiconductor processing environment at a preset interval without the need to remove sensor 512 from the processing environment to charge sensor 512. Recharging sensor 512 within container 500 can enable an operator to optimize the speed of robots and/or automated guided vehicles (AGVs) to maximize output and minimize particulate generation due to excessive shock and vibration, for example.

Figure 6:
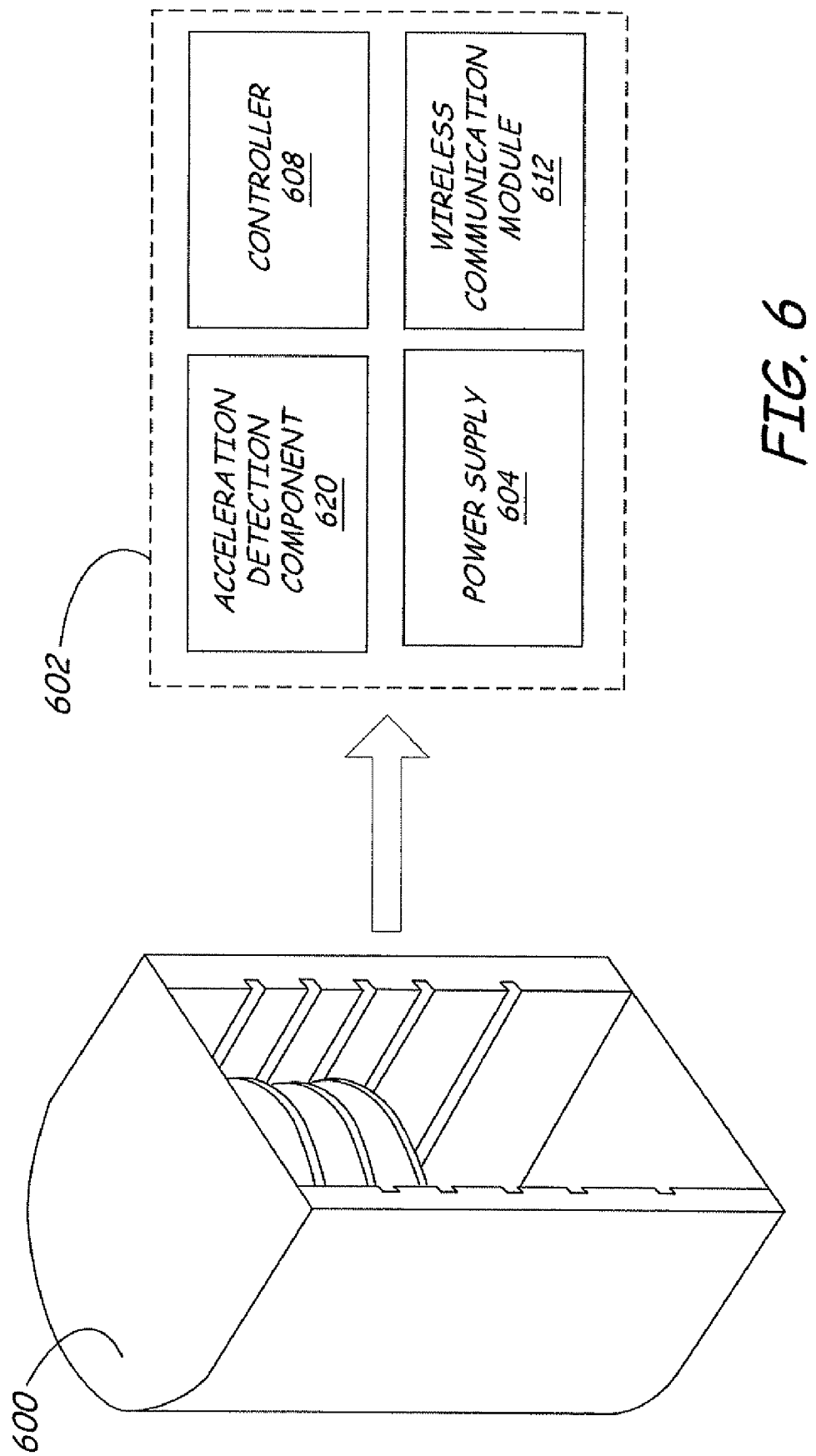
FIG. 6 is a diagrammatic view of a Front Opening Unified Pod (FOUP) including an acceleration detection component.

In accordance with one embodiment, a sensor for providing acceleration information can be mounted on, in, or proximate to, a wafer carrier configured to carry one or more substrates. Examples of a wafer carrier include, but are not limited to, a wafer container, a Front Opening Unified Pod (FOUP), shipping boxes, transport boxes, and/or storage boxes for wafers or substrates. FIG. 6 is a diagrammatic view of one embodiment of a wafer carrier, illustratively a Front Opening Unified Pod (FOUP) 600, including a sensor 602 configured to provide acceleration information. FOUP 600 is illustratively a device that is used to carry wafers in a semiconductor processing systems. While wafers are held within a respective FOUP, it is possible that the wafers could be subjected to, or otherwise contacted with accelerations based upon movements of the FOUP.

In accordance with one embodiment, sensor 602 is mounted on, in, or proximate to, FOUP 600 and is configured to measure acceleration information indicative of shock and/or vibration experienced by FOUP 600. Sensor 602 includes a power supply 604, a controller 608, a wireless communication module 612, and an acceleration detection module 620. Components 604, 608, 612, and 620 are, in one embodiment, substantially similar to components 204, 208, 212, and 220, respectively, illustrated in FIG. 2. In this manner, sensor 602 is similar to sensor 200, but is mounted within a FOUP and need not be substrate-like. Further, sensor 602 can also include a power management module and a memory, such as power management module 206 and memory 210, illustrated in FIG. 2.

Sensor 602 is configured to obtain acceleration information using one or more accelerometers and transmit the information in real-time, or substantially real-time, to an external device and/or software component. Sensor 602 allows accelerations (i.e., mechanical shocks and/or vibrations) occurring to FOUP 600, and thus substrates maintained within FOUP 600, to be identified, measured, diagnosed, et cetera. In this manner, providing sensor 602 within FOUP 600 can allow shocks and/or vibrations occurring to the semiconductor substrates while they are held within FOUP 600 to be isolated and quantified. Additionally, other sensors, in addition to the accelerometer(s) utilized in component 620, can be utilized. Such additional sensors include temperature sensors, humidity sensors, pressure sensors, and/or any other type of sensor that is able to transduce a condition of the environment experienced by the FOUP and/or the substrates held within the FOUP.

It is noted that in other embodiments, sensor 602 can be mounted on, in, or proximate to, other types and configurations of wafer carriers configured to carry one or more substrates, such as, but not limited to, wafer containers, shipping boxes, transport boxes, and/or storage boxes.

Figure 7:
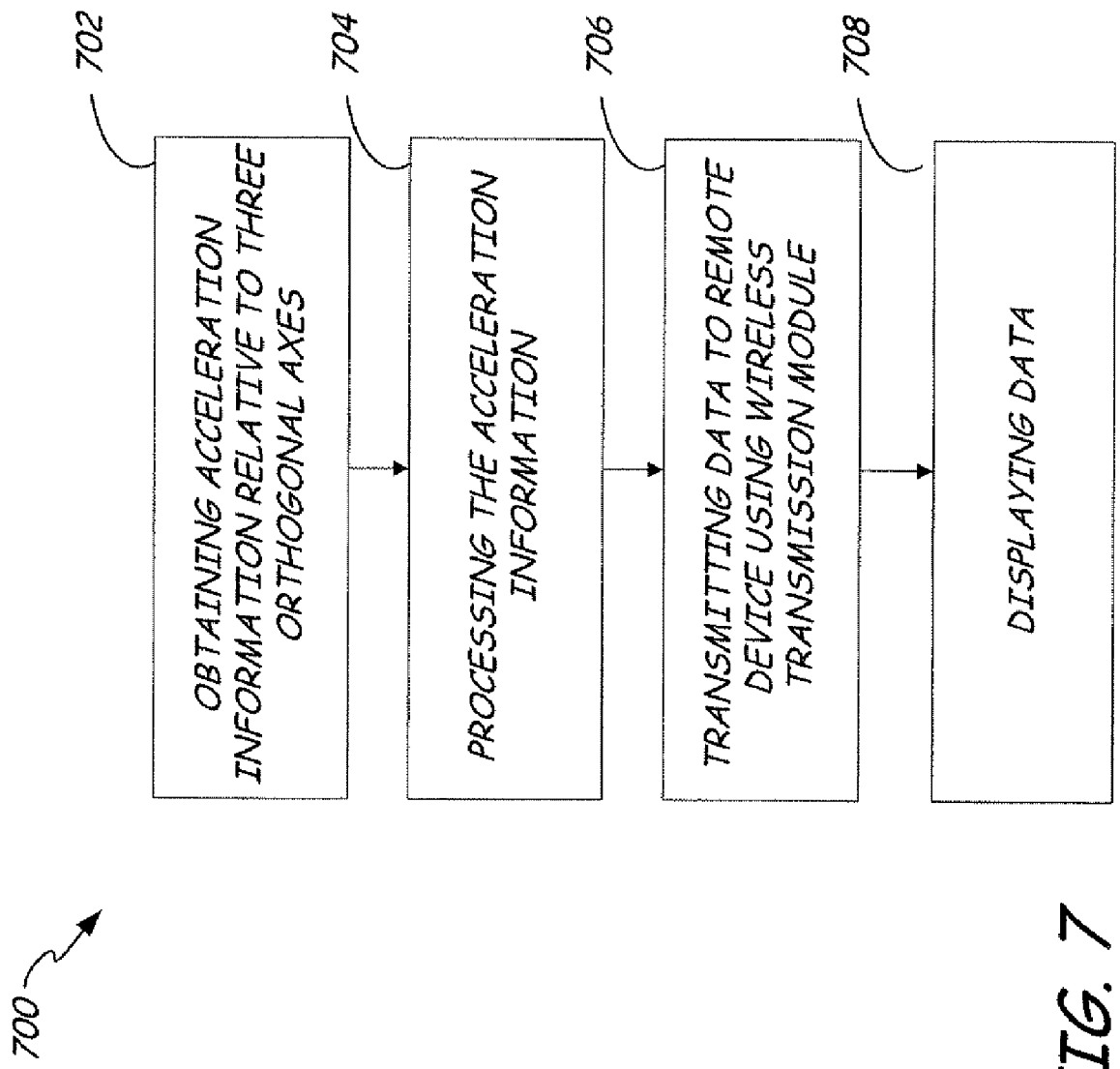
FIG. 7 is a flow diagram of a method for providing acceleration information with a sensor.

FIG. 7 is a flow diagram of a method 700 for providing acceleration information with a sensor. In one example, method 700 is implemented by wireless substrate-like sensor 200. In another example, method 700 is implemented by sensor 602.

At step 702, acceleration information is obtained relative to three orthogonal, or substantially orthongonal, axes. For example, one or more accelerometers of an acceleration detection module can be configured to provide acceleration information relative to three nominally orthogonal axes, such as axes x, y, and z illustrated in FIG. 3. In other embodiments of method 700, acceleration information is obtained relative to axes that comprise more than (or less than) 3 axes and/or axes that are not orthogonal. Further, in other embodiments acceleration information can be obtained relative to rotational acceleration.

At step 704, the acceleration information is processed by the sensor. Step 704 can include, for example, analyzing, converting, and/or compressing the acceleration information. In one embodiment, step 704 includes processing the acceleration information into data packets. Further, step 704 can include performing part, or all, of spectrum analysis on the acceleration information to provide diagnostic information, such as providing vector representations of individual shocks and/or vibrations at certain points in time. The utilization of 3-axis acceleration measurement provides operators and/or software with the ability to determine which direction an individual vibration or shock is originating from.

It is noted that one or more of the processing steps at block 704 are optional and/or can alternatively be performed by an external device after the data is transmitted to the external device.

At step 706, the data comprising the acceleration information is transmitted to an external device. For example, the sensor can be configured to transmit the data in real-time, or substantially real-time, to an external device that is either within or outside of the processing environment.

At step 708, the data is rendered by the external device. For example, the data transmitted at step 708 can be displayed graphically and/or numerically. Further, the data can be utilized for optimization or adjustment of a robotic handling and/or transport system parameter.

Although the present invention has been described with reference to preferred embodiments, workers skilled in the art will recognize that changes may be made in form and detail without departing from the spirit and scope of the invention. Although embodiments of the present invention have been described with respect to acquiring acceleration information and processing such information to ascertain vibration information associated with three orthogonally-oriented axes, features can be provided to acquire additional information. For example, the wireless sensor, in some embodiments, is adapted to acquire acceleration information along more than three axes and/or in more than three degrees of freedom. Further, other sensors can be utilized such as, for example, temperatures sensors, humidity sensors, pressure sensors, image acquisition sensors, and/or any other type of suitable sensor.

What is claimed is:

1. A wireless substrate-like sensor comprising:
   a power source adapted to provide power to the sensor;
   a wireless communication module coupled to the power source;
   a controller coupled to the power source and the wireless communication module; and
   an acceleration detection component operably coupled to the controller to provide acceleration information relative to acceleration of the sensor in three axes, wherein the acceleration detection component is configured to provide acceleration information with respect to three directions corresponding to the three axes, the three directions being orthogonal to each other.

2. The sensor of claim 1, wherein the wireless communication module is configured for substantially real-time transmission of the acceleration information to a remote device.

3. The sensor of claim 1, wherein the acceleration detection component comprises a three-axis accelerometer configured to provide acceleration information relative to each of the three directions.

4. The sensor of claim 3, wherein the three-axis accelerometer comprises a microelectromechanical system (MEMS) accelerometer.

5. The sensor of claim 1, wherein the acceleration detection component comprises a plurality of single axis accelerometers, wherein at least one single axis accelerometer is configured to provide acceleration information relative to each of the three directions.

6. The sensor of claim 5, wherein the plurality of single axis accelerometers comprise microelectromechanical system (MEMS) accelerometers.

7. The sensor of claim 1, wherein the acceleration detection component comprises a plurality of accelerometers, wherein each accelerometer is a single-axis accelerometer or a dual-axis accelerometer configured to provide acceleration information relative to one or more axes.

8. The sensor of claim 1, and further comprising a data storage component configured to store data received from the acceleration detection component in data packets, wherein the data packets are transmitted by the wireless communication module to an external device and contain data representing the acceleration information.

9. The sensor of claim 8, and further comprising a processor configured to perform spectrum analysis of the data provided by the acceleration detection component.

10. The sensor of claim 9, wherein the processor is disposed on the sensor.

11. A carrier configured to carry a plurality of substrates, the carrier comprising:
- a plurality of slots, each slot being configured to carry a respective substrate; and
- a sensor disposed within the carrier to transduce acceleration to which the carrier is subjected, the sensor having a wireless communication module for providing information relative to the acceleration, wherein the sensor comprises:
  - a power source adapted to provide power to the sensor;
  - a controller coupled to the power source and wireless communication module; and
  - one or more accelerometers configured to provide acceleration information to the controller relative to acceleration of the sensor in three axes wherein the one or more accelerometers are configured to provide acceleration information with respect to three directions that correspond to the three axes, wherein the three directions are substantially orthogonal to each other.

12. The carrier of claim 11, wherein the carrier is a Front Opening Unified Pod (FOUP) configured to carry a plurality of substrates.

13. The carrier of claim 11, wherein the wireless communication module is configured for substantially real-time transmission of the acceleration information to a remote device.

14. A method for obtaining information indicative of vibration with a sensor within a semiconductor processing environment, the method comprising:
- a) providing at least one accelerometer associated with the sensor and configured to obtain information relating to acceleration of the sensor;
- b) utilizing the at least one accelerometer to obtain acceleration information relating to acceleration of the sensor relative to three axes that are substantially orthogonal;
- c) processing the acceleration information within the sensor; and
- d) transmitting the acceleration information with the sensor to a device that is remote from the sensor, wherein steps (b) and (d) occur in substantially real-time.

15. The method of claim 14, wherein step c) comprises receiving the acceleration information and forming data packets representing a portion of the acceleration information, and wherein step d) comprises transmitting the data packets to the remote device.

16. The method of claim 15, wherein step c) comprises utilizing a processor within the sensor to perform spectrum analysis on the acceleration information.

17. The method of claim 14, wherein the sensor is a substrate-like sensor.

18. The method of claim 14, wherein the sensor is mounted on or is proximate to a Front Opening Unified Pod (FOUP) configured to carry a plurality of substrates.

* * * * *